Feb. 20, 1940. A. W. PLENSLER Re. 21,366

AUTOMATIC ELECTRICAL RADIO BROADCAST AND WAVE SELECTOR

Original Filed Sept. 3, 1929 10 Sheets-Sheet 1

Inventor
Alexander W. Plensler
by Fabel & Banning Attys.

Feb. 20, 1940. A. W. PLENSLER Re. 21,366

AUTOMATIC ELECTRICAL RADIO BROADCAST AND WAVE SELECTOR

Original Filed Sept. 3, 1929 10 Sheets-Sheet 2

Inventor
Alexander W. Plensler
by Zabel & Banning Attys.

AUTOMATIC ELECTRICAL RADIO BROADCAST AND WAVE SELECTOR

Original Filed Sept. 3, 1929 10 Sheets-Sheet 3

Inventor
Alexander W. Plensler
by Zabel & Banning Attys.

AUTOMATIC ELECTRICAL RADIO BROADCAST AND WAVE SELECTOR

Original Filed Sept. 3, 1929 10 Sheets-Sheet 4

Inventor
Alexander W. Plensler
by Zabel & Banning Attys.

AUTOMATIC ELECTRICAL RADIO BROADCAST AND WAVE SELECTOR

Original Filed Sept. 3, 1929 10 Sheets-Sheet 5

Inventor
Alexander W. Plensler
by Zabel & Bauning Attys.

AUTOMATIC ELECTRICAL RADIO BROADCAST AND WAVE SELECTOR

Original Filed Sept. 3, 1929 10 Sheets-Sheet 6

Inventor
Alexander W. Plensler
by Zabel & Banning Attys.

AUTOMATIC ELECTRICAL RADIO BROADCAST AND WAVE SELECTOR

Original Filed Sept. 3, 1929 10 Sheets-Sheet 7

Inventor
Alexander W. Plensler
by Zabel & Banning Attys

AUTOMATIC ELECTRICAL RADIO BROADCAST AND WAVE SELECTOR

Original Filed Sept. 3, 1929 10 Sheets-Sheet 8

Inventor
Alexander W. Plensler
by Zabel & Banning Attys.

AUTOMATIC ELECTRICAL RADIO BROADCAST AND WAVE SELECTOR

Original Filed Sept. 3, 1929 10 Sheets-Sheet 9

Inventor
Alexander W. Plensler
by Fabel & Banning Attys

AUTOMATIC ELECTRICAL RADIO BROADCAST AND WAVE SELECTOR

Original Filed Sept. 3, 1929 10 Sheets-Sheet 10

Inventor
Alexander W. Plensler
by Fabel & Banning Attys.

Reissued Feb. 20, 1940 Re. 21,366

UNITED STATES PATENT OFFICE 21,366

AUTOMATIC ELECTRICAL RADIO BROADCAST AND WAVE SELECTOR

Alexander W. Plensler, Chicago, Ill., assignor to Belmont Radio Corporation, Chicago, Ill., a corporation of Illinois Original No. 2,114,068, dated April 12, 1938, Serial No. 390,064, September 3, 1929. Renewed November 17, 1937. Application for reissue May 11, 1939, Serial No. 273,150

48 Claims. (Cl. 250—40)

My invention relates to means for automatically tuning radio receiving apparatus in order to select various wave lengths upon which broadcast systems are transmitting.

It is the principal purpose of this invention to provide a system whereby any one of a plurality of wave lengths or stations, as they are usually referred to, may be selected by a simple operation such as pressing a button with such a degree of accuracy as to make it unnecessary for one to operate the tuning controls in any other manner except by the use of this system.

It is also a purpose of this invention to provide a system of this character which will automatically cut off the emanation of sound by the loud speaker of the set during the time a station selection is being made and then will automatically connect in the loud speaker so as to cause it to become operative when the selection is completed.

My invention also contemplates certain improvements in systems of this character whereby the tuning devices may be caused to change their position by driving connection from the motor in such a manner that there is no danger of overrunning past the station which is to be selected due to the action of the motor.

Another important object of my invention is the provision of means in a system of this character whereby the receiving apparatus may be controlled from any one of a plurality of different points not only as to the selection of stations but also as to the volume and as to turning the set on or off.

In this connection, my invention contemplates the provision of means whereby a control unit situated at a remote point in respect to the radio set may be caused to remove the control setting at another point and thereafter caused to control the tuning and volume of the set from the first named remote point.

My invention contemplates also as an object the provision of a novel means of automatically tuning or wave selection which is operative to affect the tuning of the receiving set only during the time that it is changing from one wave length to another and which leaves the tuning device free from manual operation at all other times. This is particularly advantageous where it is desired only to apply the automatic control to a limited number of stations, and, when one does not wish to listen to these stations, to have the set free for ordinary tuning manually. With the present invention it is possible to tune the set manually at any time without in any way interfering with the future accuracy of operation of the automatic tuning system and without making any changes in the connection of the automatic system to the tuning device. The ordinary tuning dial is used the same as it would be if the automatic system were not employed.

It is also a purpose of this invention to provide in a system of this character a novel means for a volume control of the receiving apparatus from a remote point.

A further object of this invention is to provide in a system of this character means whereby the stations which are to be selected by the automatic system may be readily changed by a relatively simple operation so that it is possible to change the entire group of stations selectable by the automatic system at any time it is desired to do so.

Other objects and advantages of the invention will appear as the description proceeds in connection with the accompanying drawings wherein the preferred form of the invention is disclosed. It is to be understood, however, that the drawings and description are illustrative only and are not to be taken as limiting the invention other than it is limited by the claims.

In the drawings—

Fig. 12 is a detailed view partly in section of the mechanism for turning the receiving set off and on;

Fig. 19 is a diagram showing the wiring connections for turning the receiving set off and on.

Referring now in detail to the drawings, I show at 5 a shaft upon which movable elements 6 of a plurality of condensers having stationary elements such as indicated at 7 are mounted. These condensers are, of course, the tuning condensers for the various stages of receiving apparatus and I show in the present instance four of these condensers although it is obvious that any desired number may be employed depending upon the stages of the receiving set that it is desired to tune. I have not shown the electrical connection of these condensers to the receiving apparatus since this forms no part of this invention which is not limited to any particular receiving apparatus.

A suitable indicating dial or drum 8 is also carried by the shaft 5 and this may be illuminated from the lamp 9 in any well known manner.

Figure 4:
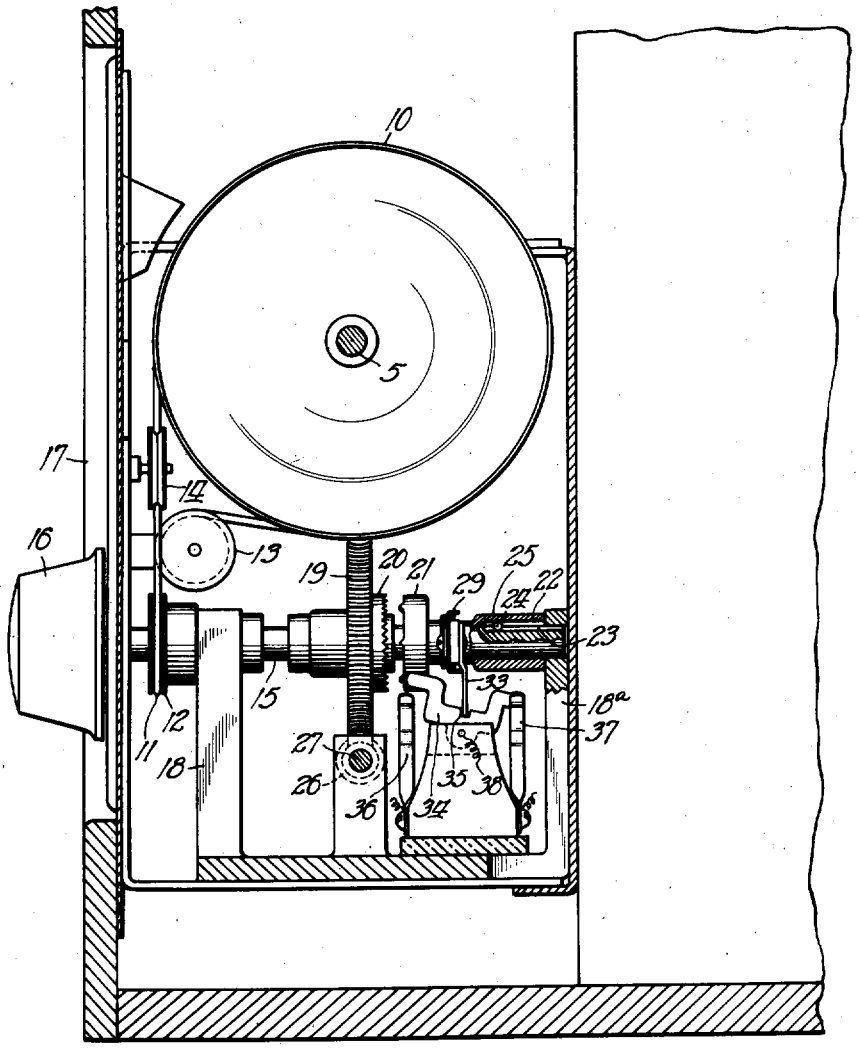
Fig. 4 is a section on the line 4—4 of Fig. 2.

The shaft 5 is rotated by means of the pulley 10 fixed thereon connected by a belt drive 11 to a second pulley 12, there being idler pulleys 13 and 14 as shown in Fig. 4 for driving the drive belt which in the present instance is shown in the form of a round cord. Pulley 12 is fixed upon shaft 15 which shaft is connected to a tuning knob 16 exteriorly of the front panel 17 provided on the receiving apparatus. Shaft 15 is supported on suitable bearings as indicated at 18 and 18*a* and has intermediate its ends a worm gear 19 rotatably mounted thereon which gear is provided with a clutch ring at 20 adapted to mesh with clutch member 21 when this member 21 is moved to the left as shown in Fig. 4. The member 21 is splined to the shaft 15 by means of cooperating keyways 22 and 23 and a ball type key 24 which permits sliding of the sleeve 25 of clutch member 21 on shaft 15 with a minimum amount of friction, but it also guarantees that member 21 will rotate with shaft 15. Suitable collars are, of course, provided to hold the gear 19 in position, and this gear meshes with a worm 26 which worm is mounted on the drive shaft 27 of a small reversible type motor 28 as shown most clearly in Fig. 2.

At this point it might be well to observe that unless the clutch member 21 is in mesh with the member 20 so as to cause rotation of shaft 15 with the gear 19, there is nothing to interfere with the turning of shaft 15 by means of the ordinary tuning knob 16 so as to manually tune the set. Therefore, any time the clutch is released, the tuning device is free of all driving connections that would interfere with manual tuning.

The means whereby automatic tuning of the set is accomplished will now be described.

Figure 3:
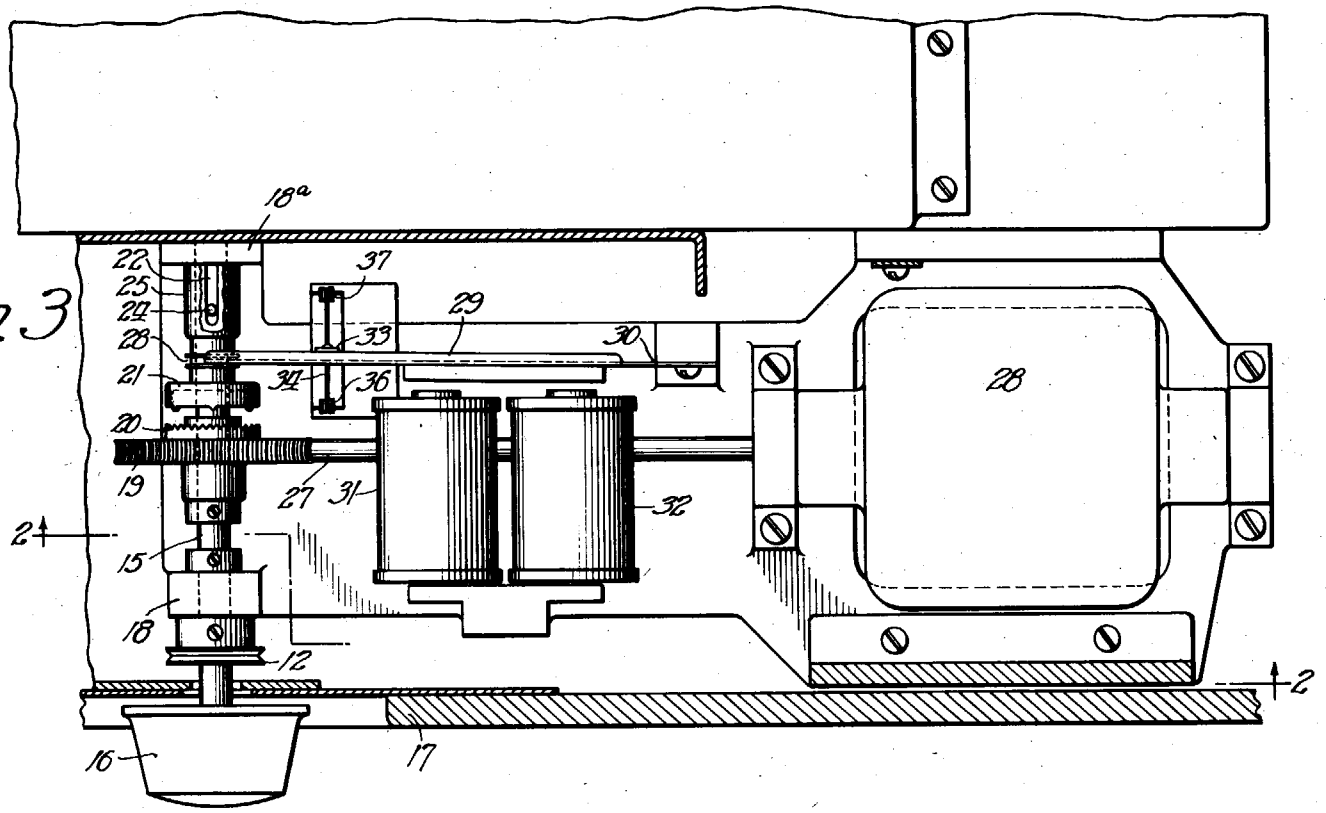
Fig. 3 is a sectional view on the line 3—3 of Fig. 2.

It will be noted from Figs. 3 and 4 in particular that clutch member 21 has a groove 28 with which the clutch operating arm 29 engages. This arm 29 is a movable armature secured at 30 to the frame and adapted to be moved by means of the attraction of the magnet coils 31 and 32 when they are energized. That is to say, when it is desired to throw in the clutch and drive the shaft 15 and with it through the medium of the belts and pulleys shaft 5 from the motor, the magnets 31 and 32 are energized to attract the armature 29 thus causing engagement between the members 20 and 21 of the clutch.

The arm 29 of the armature also carries a depending arm member 33 which arm member engages a pivoted yoke 34 by extending into the notch 35 therein. This yoke is adapted to shift contact between a pair of contacts such as indicated at 36 and 37. The center of this yoke 34 is connected as indicated by the numeral 38 in circuit with some of the other apparatus as will be presently described, so that the effect of shifting from one side to the other is to alternately close points in two different circuits.

Mounted on the shaft 5 are a plurality of cam units such as indicated at 39, 40, and 41. These units are made up of pairs of sections 42 and 43 which together make up a complete circle or disc with the exception of slight apertures at 44 and 45 between the separate halves. At the center of the elements 42 and 43 they extend through a complete circle as indicated at 46 in Fig. 5 and have laterally extending flanges 47 and 48 which flanges are contacted by suitable spring contacts 49 and 50. The shaft 5, where it extends through these cam members, has an enlarged sleeve portion 51 which is flattened as indicated at 52, and insulating bushings such as shown at 53 are interspersed between the cams which are also mounted on insulating members such as indicated at 54. In this way, the cams are kept spaced and insulated from each other and also from the shaft. This construction it will be noted also insulates section 42 of the cams from section 43.

Now the insulating pieces 54 and 53 are clamped in position on the member 51 by suitable nuts such as shown at 55 and 56 and this clamping is preferably made only so tight as to normally prevent turning of the cam members on the shaft 51. However, due to the frictional gripping between the insulating pieces 53 and 54, it is an easy matter to turn the shaft 5 and the sleeve 51 while holding any one of the cam members 39, 40, or 41 against rotation.

The cam members can thus be adjusted circumferentially around the shaft 5 to change their relative position with respect to the movable blades 6 of the tuning condensers. The purpose of this is to permit adjustment of these cam members which control, as will be brought out presently, the amount of turning which will be given to the tuning condensers each time the clutch members 20 and 21 are brought together and the motor started.

Figure 5:
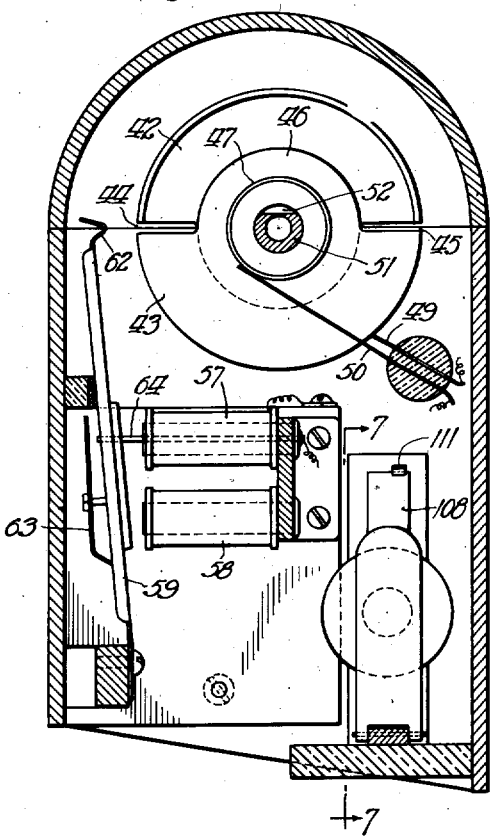
Fig. 5 is a section on the line 5—5 of Fig. 1.
Figure 6:
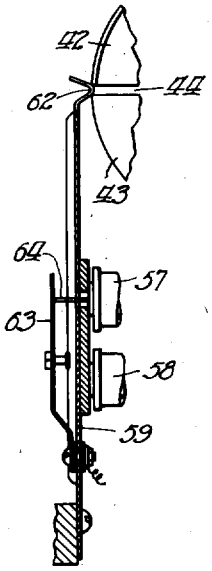
Fig. 6 is a detailed section of a portion of the structure shown in Fig. 5.

Figs. 5 and 6 show means whereby the cam members 42 and 43 are brought into action to control the termination of the turning of the movable condenser elements at the proper position for the station to be selected. An electromagnet consisting of the two coils 57 and 58 is mounted below each of the cam members 39, 40, 41, etc., and in position to be attracted by these magnets there is situated a series of armatures such as 59, 60, and 61. These armatures, as indicated in Fig. 5, have at their free ends a contacting portion 62 which contacting portion is adapted when the armature is attracted by the electro-magnets to engage the outer surface of one of the cam members depending upon which armature is attracted by its corresponding electro-magnet.

Now at the same time this armature is attracted, the second contact member 63 carried by the armature 59 and insulated therefrom is brought forward to contact with a contacting pin 64 which pin extends through the core of coil 57. The contact between the member 63 and pin 64 is adapted to close another point in the energizing circuit as will be brought out presently in connection with the wiring diagram of the system.

Figure 18:
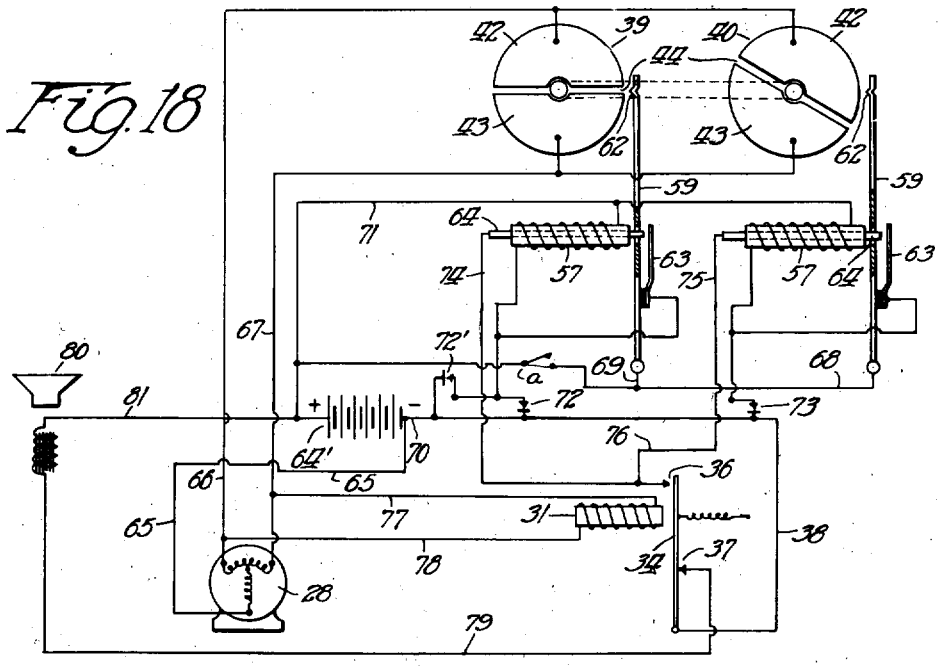
Fig. 18 is a wiring diagram showing the electrical connections for two stages of wave lengths control.

Referring now to Fig. 18, the wiring connections for a pair of cam elements such as 39 and 40 is shown it being understood, of course, that the remainder of the cam elements are wired in a like manner to the two shown. In this diagram, a source of current as indicated at 64' is connected by means of one lead 65 to one terminal of the reversible split field motor 28. Another terminal of this motor is connected by means of the lead 66 to one of the cam sections 42 of each of the cam members 39 and 40 these sections being connected in parallel as shown. The other terminal is connected by means of a lead 67 to the sections 43 of the cam members 39 and 40. The armatures 59 are connected as by leads 68 and 69 to the positive side of the source of current as illustrated in Fig. 18. The electro-magnets 57 including also the extra coil 58 which for the sake of convenience in the wire diagram has been shown as a single magnet have one terminal connected by means of the lead 71 to the positive side of the source of current. The other terminals of these electro-magnets are connected through suitable push buttons, which will be describd later, indicated at 72 and 73 to the negative side 70 of the source of current.

Connected to contact 36 are the conductors 74 and 75 which conductors connect to the pins 64 which pins 64 are adapted to engage as described hereinbefore with the contact members 63 which contact members are connected to the leads from coils of magnets 57 to the contacts of push buttons 72 and 73. The yoke 34 has been shown diagrammatically in connection with the armature 29 and the electro-magnetic coils 31 and 32, with the electro-magnet referred to in the diagram sketch of Fig. 18 as 31 and the armature as a single movable armature 34 having a pair of contacts with which the terminals 36 and 37 engage, this armature being connected by means of conductor 38 with the terminal 70 of the source of current. Electro-magnet 31 is energized by means of leads 77 and 78 connected across the leads 66 and 67 of the motor so that any time the motor is energized this electro-magnet will also be energized. The terminal 37 is connected by means of a lead 79 to one side of the loud speaker indicated at 80, the other side thereof being connected by means of the lead 81 to one terminal of the source of current 64'.

Now the operation of the system to rotate the tuning device is accomplished as follows:

Assuming that the station corresponding to the push button 72 is to be selected, push button 72 is depressed to close a circuit extending from the source of current through lead 71, coil of magnet 57, contacts of push button 72 to terminal 70 of the source of current. This energizes electro-magnet 57 associated with button 72, and this magnet in turn attracts armature 59 associated therewith which armature 59 contacts with segment 43 of cam member 39.

At the same time contact 63 engages the end of the pin 64 and completes a holding circuit for the previously energized magnet 57 over the following path:

Positive side of source of current, conductor 71, coil of magnet 57, contact 63, pin 64, conductor 74, terminal 36 (electro-magnet 31 was energized by the depression of push button 72 over a path which will be presently described, so armature 34 is now in contact with terminal 36), armature 34, and conductor 38 to negative side of source of current at 70. This completed circuit will, of course, hold the electro-magnet 57 energized independently of the push button 72 which is only momentarily depressed. Contacting of armature 59 with segment 43 completes an energizing circuit for the motor by connecting lead 67 thereof through the segment 43, armature 59, and switch "a" to the positive side of source of current 64'.

The motor is energized in this fashion and when so energized rotates the shaft 5 carrying the cams 39 and 40 in a clockwise direction. Armature 59, of course, remains in contact with the segment 43 during this operation. The energization of the electro-magnet 31 has, of course, thrown the clutch member 21 into engagement with the clutch member 20, so that as the motor rotates it drives shaft 5 through the medium of shaft 15 and the associated pulleys and belt connection.

As another result of the energization of electro-magnet 31, the circuit is broken at 37 for the loud speaker 80, so that the loud speaker is rendered inoperative during the tuning operation.

The motor is energized until such time as the contacting portion 62 of armature 59 falls into the depression 44 between segments 42 and 43 at which time these segments are electrically connected by means of this contacting portion 62 to short circuit the motor leads 66 and 67 and thereby the electro-magnet 31. The immediate result of this short circuit is to release the armature 34 which will fall back due to its being a spring armature to open the clutch and thus stop the rotation of shaft 5 suddenly. Armature 34 in falling back also breaks the energizing circuit for electro-magnet 57 at 36 which permits armature 59 to fall back and restore the circuit to normal with the motor deenergized due to the fact that positive side of battery 64' is now disconnected from either lead 66 or 67. At the same time the falling back of armature 34 closes at 37 the energizing circuit for the loud speaker 80 to cause the loud speaker to again be put in operation.

As this adjustment of the tuning of the shaft 5 by stopping the cams such as 39 and 40 on a definite point may be made quite critical, tuning to the desired station is made very accurate so that no further fine tuning is necessary after the station has been selected by the automatic device.

The operation of push button 73 will, of course, have the same effect to energize the associated electro-magnet 57 and attract the associated armature 59, but, owing to the different setting of the cam 40 for a different wave length, the armature 59 associated with button 73 will contact as shown in Fig. 18 with segment 42 of cam 40. This will result in energization of the motor 28 by connecting negative battery to lead 66, so that in this case the motor will be rotated in a counterclockwise direction, and the operation repeated with this variation in the same manner as has been previously described.

In this manner, it is possible to select as many stations as there are provided cam members such as 39 and 40 by adjustment of the cams as has been hereinbefore described. It is, of course, possible to change the wave length which any cam will cause to be selected, so that the entire range of stations or any individual station may be removed from the automatic selecting device and replaced with any other station desired. This may be done without the aid of an expert or without changing any of the connections of the apparatus.

Now to adjust any cam member so as to set it for a different station the switch "a" which is normally closed is used. The button 72 corresponding to the station to be changed is pressed. This operates the selecting mechanism to bring the cam corresponding to that button into position to bring part 62 into gap 44. Switch "a" located on the panel is then opened and button 72 is again depressed. This energizes coil 57 and attracts arm 59. Coil 57 is locked energized in a novel manner. The attraction of armature 59 into gap 44 causes it to contact with the end of the core of magnet 57. The energizing circuit for this magnet may then be traced over the following path: positive lead 71, coil of magnet, contact 63, pin 64, core of magnet, armature 59, cam 39, leads 66 and 67 of motor 28, winding of motor 28, and lead 65 to negative battery at 70. Leads 66 and 67 of the motor field being short circuited by cam 39, the motor remains stationary and magnet 31 is not energized.

The manual tuning knob 16 can now be turned and part 62 will hold cam 39 against rotation while the shaft 5 is turning. The shaft 5 is turned in this fashion until the desired station or wave length is tuned in. When this is accomplished, switch "a" is moved to its original position which deenergizes coil 57, and restores the system to normal ready to use. In this fashion the wavelength for all of the push buttons and their associated cams may be varied at will without the necessity of getting inside the selector or manually holding anything.

The electrical characteristics of this system are such that it is practically fool proof. For instance, if two buttons such as 72 and 73 are depressed at the same time, no harm can result. If their corresponding arms 59 are opposite on cam sections 42, the shaft will be turned until the first gap 44 of the two is reached when the motor will be deenergized; and, if one arm is opposite section 42 and the other opposite 43, then nothing will happen when both buttons are depressed, as the motor leads 66 and 67 will be connected to each other thru arms 59 and conductor 68.

Keys 72 and 73 may be located at any desired point, either at the receiving set or remote therefrom. I also provide means whereby duplicate sets of such keys may be arranged at different points so that the control of station selection may be had at several points remote from or at the receiving apparatus. The wiring diagram by means of which this is accomplished is, of course, the same as shown in Fig. 18 with the exception that instead of a single button 72 parallel leads may be run to additional buttons such as indicated at 72' in Fig. 18 so that the circuit energizing the electro-magnets 57 may be completed at any point where a button such as 72 or 72' is located. It is to be understood, of course, that there are as many buttons provided at each point as there are stations to be selected.

The arrangement of this duplication of selecting buttons is illustrated in Figs. 9 to 15 and will now be described.

Figure 9:
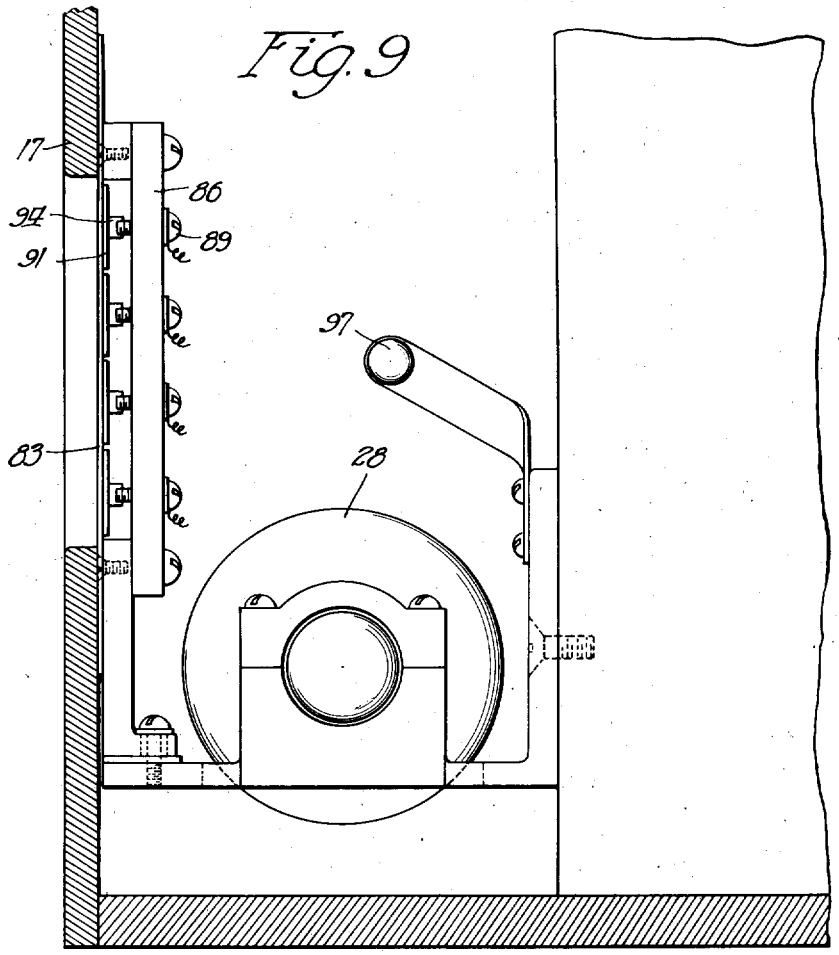
Fig. 9 is a vertical section taken at the right hand end of Fig. 2 and illustrating a portion of the control cam.
Figure 10:
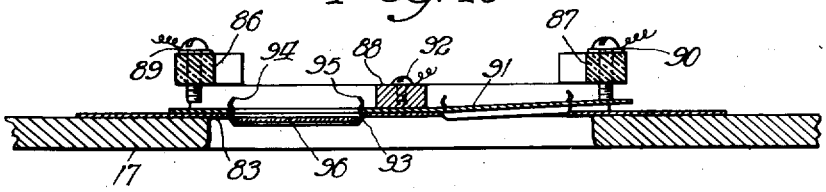
Fig. 10 is a section taken on a horizontal line 10—10 of Fig. 11.
Figure 14:
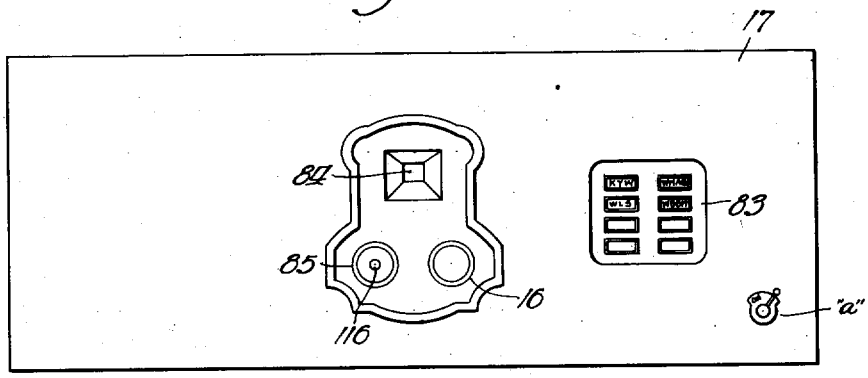
Fig. 14 is a view of the front panel of the radio showing the control panel mounted thereon.
Figure 11:
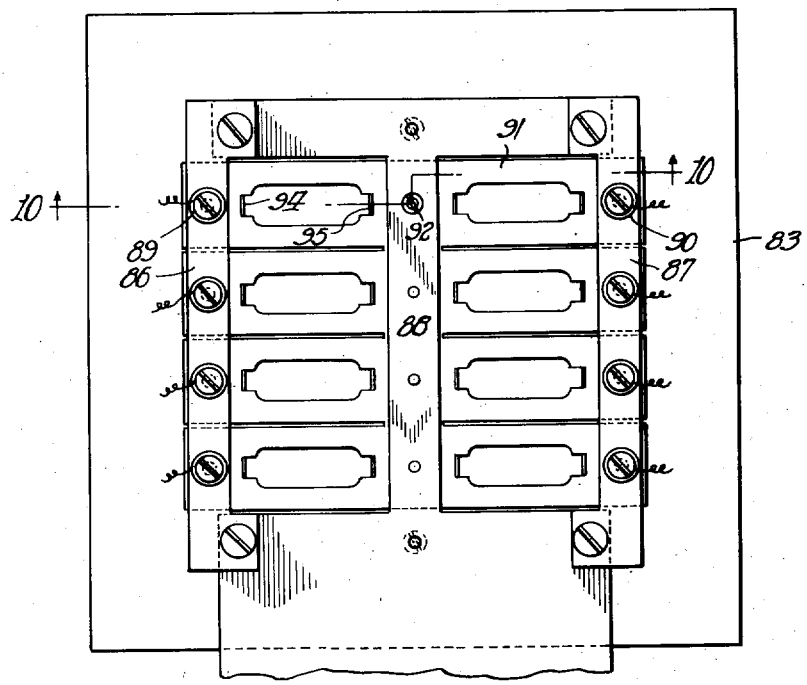
Fig. 11 is a rear view of the control panel at the receiving set.

In Fig. 14, there is shown the front panel 17 of a radio receiving apparatus having thereon a button panel as indicated at 83, this panel 17, of course, having the tuning handle 16 thereon for tuning independently of the automatic wave selecting device and having an aperture as at 84 through which the dial or drum 8 is visible. A suitable volume control knob is indicated at 85 which knob will also be described in connection with the volume control. The panel 83 is shown in vertical section in the end view, Fig. 9, and the rear view, Fig. 11, while Fig. 10 is a horizontal section thereof.

Figure 1:
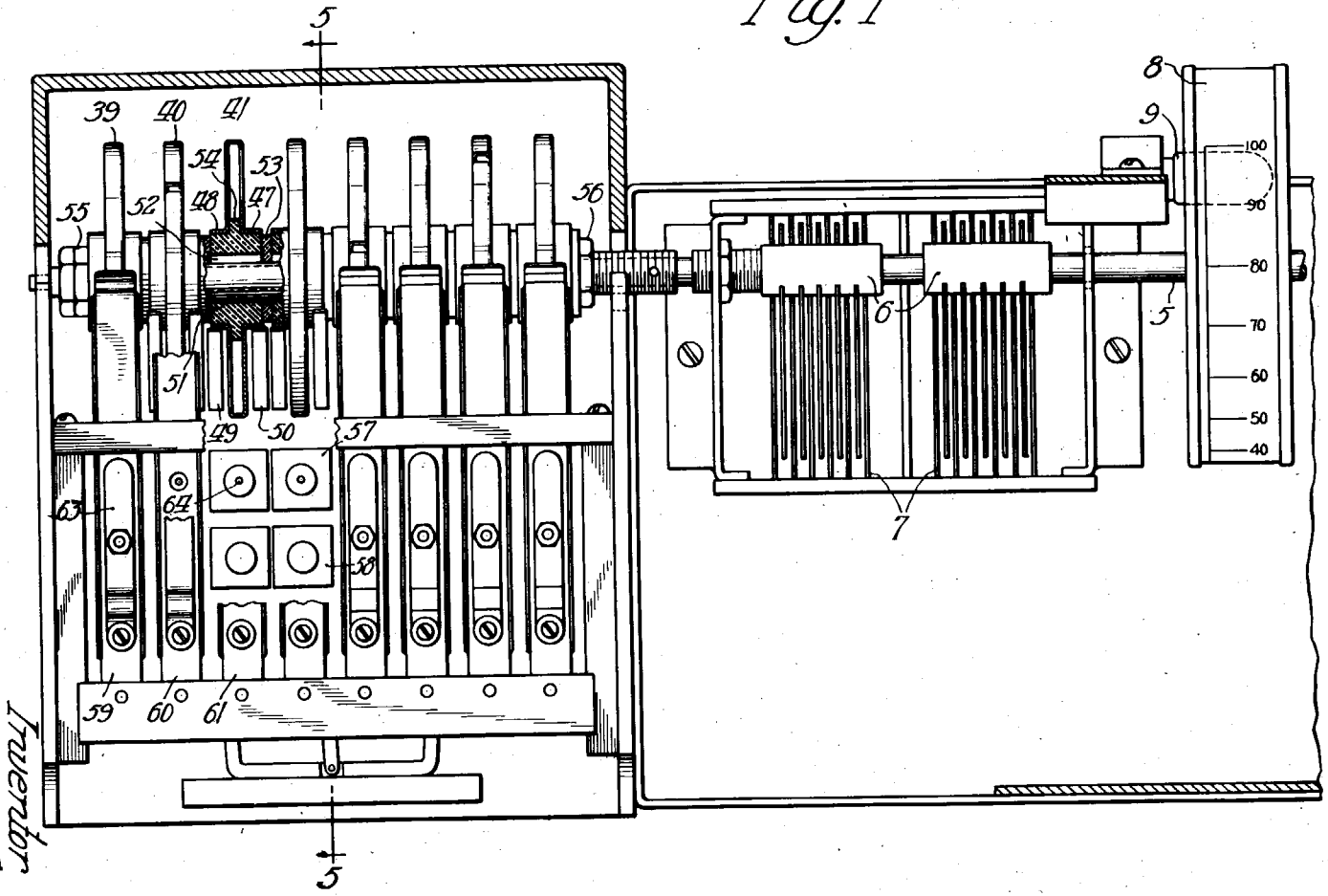
Fig. 1 is a front view partly in section showing my control mechanism as applied to tuning condensers mounted in tandem upon a drive shaft.
Figure 2:
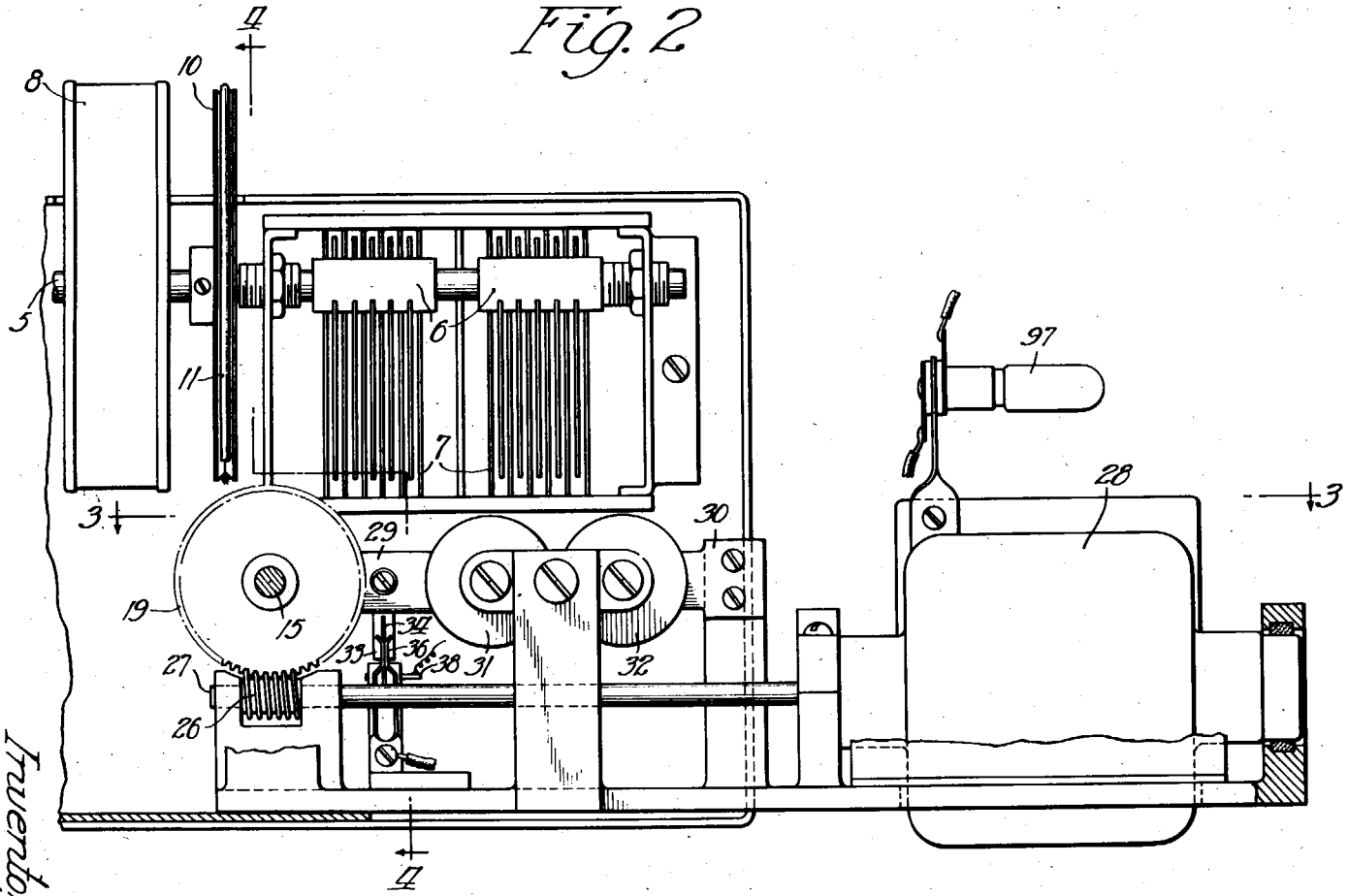
Fig. 2 is a view showing that portion of the equipment which is to the right of Fig. 1, so that Figs. 1 and 2 show mechanism substantially all of the unit.

The construction of this panel is as follows:

Mounted on the back of the panel 17 are a plurality of insulating frame members 86, 87, and a grounded aluminum bracket 88, the members 86 and 87 having thereon vertical rows of terminal screws such as 89 and 90 which terminal screws extend through and have a free end spaced from the front panel 83. On the member 88 there are provided a plurality of spring plates 91 which are connected at their center as indicated at 92 to one side of the source of current as for instance to the side 70 as indicated in Fig. 18. The panel 83 is, of course, of conducting material. The spring plates 91 are apertured to receive clips 93 which are adapted to snap in and out of an aperture readily by means of the spring fingers 94 and 95 thereon and the clips 93 carry suitable indicating plates 96 preferably of insulating material and preferably translucent which plates carry thereon the call letters of the station which is to be selected by the depression of the spring plate associated therewith to contact with the associated terminal 89 or 90. A suitable lamp as indicated at 97 in Fig. 2 and Fig. 9 is used to illuminate the case at the receiving apparatus. For a duplicate set of keys reference is made to the control box shown at 98 in Fig. 15 which has mounted therein in the same manner as the mounting on panel 83 a duplicate series of keys or buttons such as shown at 93', the wiring connections being made through the cable 99 from this key box 98. Cable 99 may be run from a set to any point desired as for instance to any other room in a house, and the control box 98 being small may be located on a table or desk or chair or placed upon a flexible cable such as 99 so as to be moved about from place to place. The practice of having a central radio receiving set and loud speakers throughout the house is becoming very common, and, by the provision of a control box such as 98 in each room where a loud speaker is placed, it is possible to have remote control of the station to be broadcast at any place where the loud speaker is to be located.

In order to make an apparatus of this kind convenient to the user; it is necessary to also provide in conjunction with the remote control apparatus a means for not only turning the set off and on from the remote point, but also controlling the volume of sound obtained from the set. I have provided a simple device whereby this may be accomplished with a small amount of equipment at the receiving apparatus and the addition of the volume control dial and shut off button at each control point.

Figure 7:
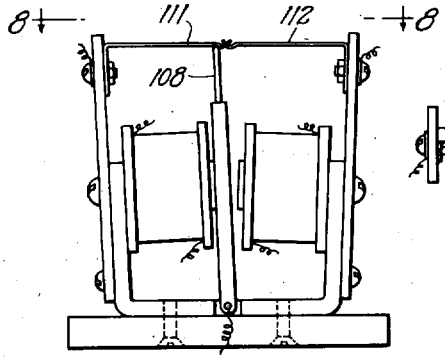
Fig. 7 is a section on the line 7—7 of Fig. 5.
Figure 8:
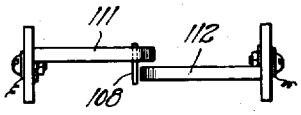
Fig. 8 is a top view of the structure shown in Fig. 7.
Figure 19:
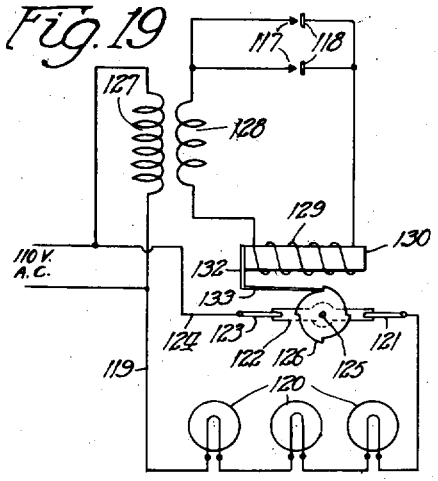
Figure 20:
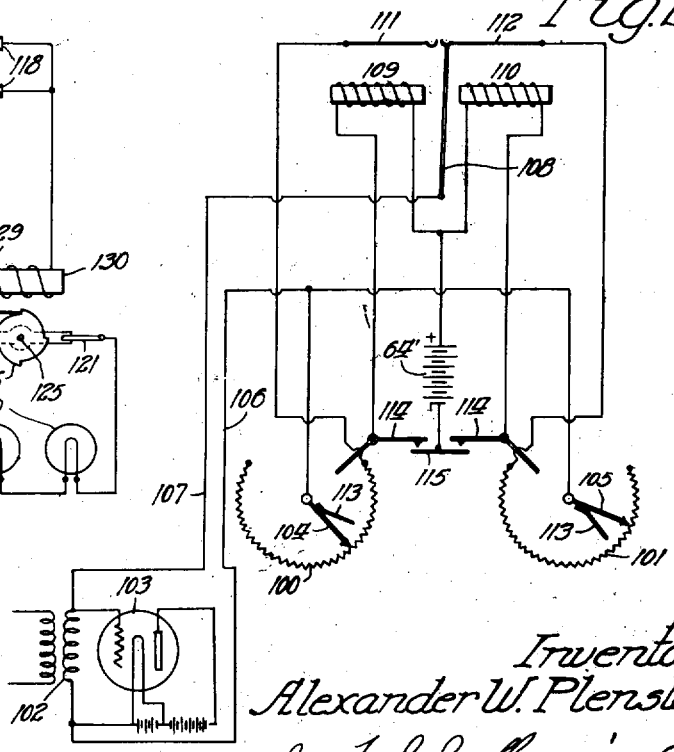
Fig. 20 shows the wiring diagram for the volume control of the receiving apparatus.

In Figs. 5, 7, and 8 of the drawings the necessary equipment at the receiving apparatus is shown and in Figs. 19 and 20 the wiring connections for turning the set on or off the controlling the volume are shown.

In regard to the volume control, referring now to Fig. 20, I provide means whereby suitable resistance such as 100 and 101 located one at each control point and are so connected that they may be shunted across a secondary 102 of one of the stages as indicated at 103 in the audio frequency amplification in the receiving apparatus in this way to control the amount of amplification which will be made of the signals received. These resistors 100 and 101 may, of course, be inserted in other points of the circuit for volume control wherever desired, this instance merely being given as an example of how volume control may be connected to the receiving apparatus. In Fig. 20 the movable contacts 104 and 105 of resistances 100 and 101 are connected in parallel by means of lead 106 to one terminal of the secondary 102. The other terminal of the secondary 102 is connected by means of a lead 107 to an armature 108 which armature is controlled by a pair of electro-magnets 109 and 110 so that when magnet 109 for instance is energized armature 108 will be moved into contact with spring contact 111, and, when magnet 110 is energized, armature 108 will be disconnected from spring contact 111 and connected to spring contact 112, these contacts 111 and 112 being connected to one terminal of the resistances 100 and 101, respectively.

Figure 16:
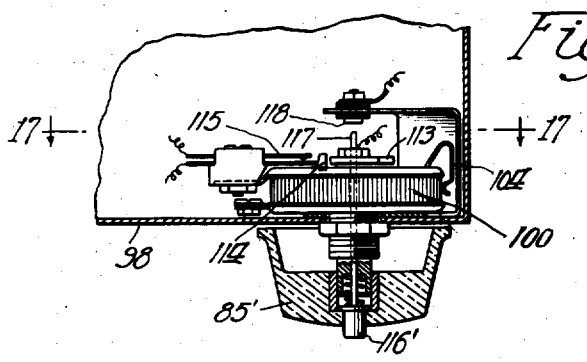
Fig. 16 is a section on the line 16—16 of Fig. 15.
Figure 17:
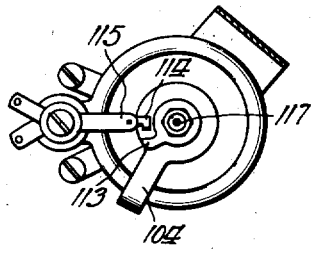
Fig. 17 is a view taken on the line 17—17 of Fig. 16 with the casing left off for the sake of clearness.

Now by turning the volume control knob 85 at the receiving apparatus or 85' at the remote control point into one limiting position, that is to the position where the secondary 102 is completely short circuited or giving a condition corresponding to no volume emanating from the receiving apparatus, an insulated member 113 carried by the shaft of the control knob is brought into position to press a spring contact 114 into engagement with contact 115 which is connected to one terminal of the source of current 64'. When this occurs, magnet 109 is energized over a path extending from the positive side of a source of current through the coil of magnet 109 back through contacts 114 and 115 to the negative side of the source of current. This results in moving armature 108 into engagement with spring contact 111 which connects resistor 100 into circuit parallel with secondary 102 and disconnects resistor 101 from the secondary by breaking contact between the armature 108 and spring contact 112. Spring contacts 111 and 112 as shown in Figs. 7 and 8 overlap so that the armature 108 can never be out of contact with both of them at the same time so that either resistor 101 or 100 is shunted across the secondary 102 at all times. As shown in Figs. 16 and 17, the elements 113 and 114 consist of cam portions mounted upon the rotating element 104 of the resistors in such position as to move the element 114 upwardly to contact with the element 115 when the movable member 104 reaches its limiting position in one direction.

In addition to the volume control just described, the volume control knobs 85 and 85' have centrally mounted therein pins 116 and 116' which may be depressed to shut off the receiving apparatus whenever it is desired. The mechanism by which this is accomplished is shown more clearly in Fig. 16 wherein the pin 116 is shown as mounted on a contact making pin 117 which pin is adapted when depressed to make contact with the stationary contact 118 and complete a circuit for opening a switch to cut off the supply of energy to the receiving apparatus.

Figure 12:
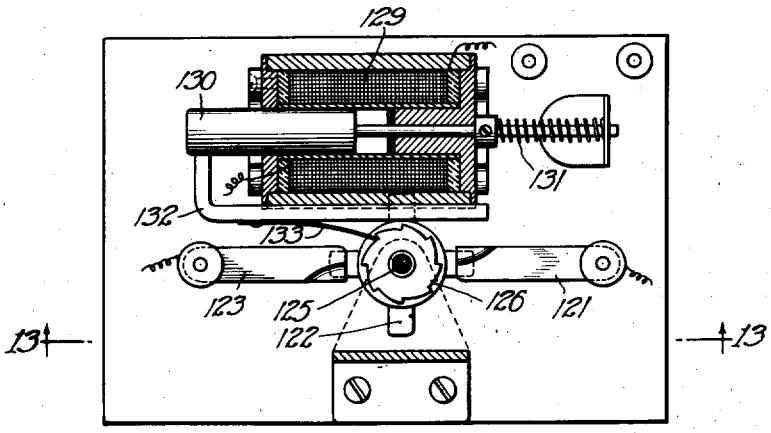
Figure 13:
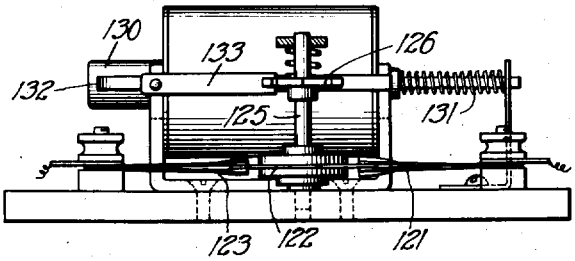
Fig. 13 is a section taken on the line 13—13 of Fig. 12.
Figure 15:
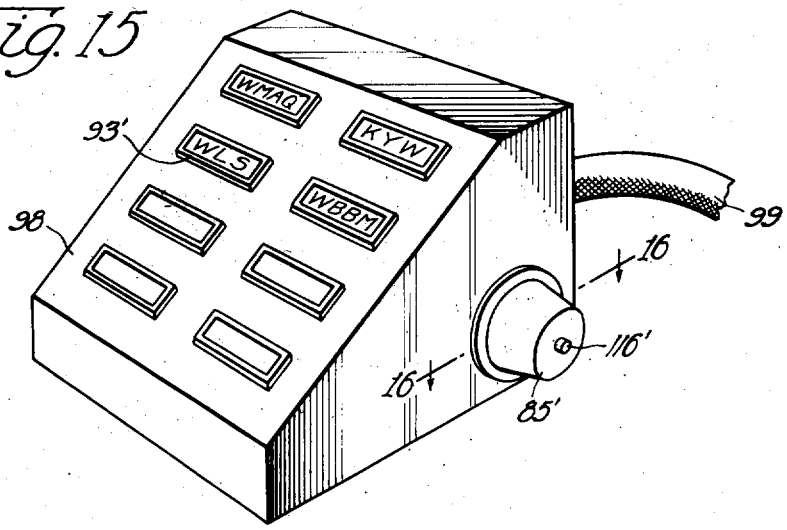
Fig. 15 is a perspective of a remotely disposed control panel which is used in conjunction with tuning apparatus.

In Fig. 19 the wiring diagram for this connection is shown, the contacts 117 and 118 being shown in duplicate, that is, one for the volume control at the receiving apparatus and one for the volume control in the control box 98. The power line is shown at 119 as being connected to the filaments of tubes 120 of the receiving apparatus and passing therethrough to contact 121 which is adapted to be connected by a bridging element 122 to a second spring contact 123 to complete circuit over a conductor 124 to the other side of the source of current supply for the tubes. The bridging contact 122 is carried on a pivoted shaft 125 as shown in Figs. 12, 13, and 19 which shaft carries the ratchet wheel 126.

Now in order to operate this ratchet wheel there is provided a step down transformer consisting of a primary 127 and a secondary 128 connected across the source of current supply for the receiving apparatus, the secondary being connected through contacts 117 and 118 to the winding 129 of a solenoid having a movable core 130. This core is spring retracted as by means of the spring 131 so that its normal position is that shown in Fig. 12. Movable core 130 carries an arm 132 which has a spring finger 133 thereon engaging with the teeth of the ratchet wheel 126. Thus it will be seen that every time a button 115 or 116 is depressed it closes one pair of the contacts 117 or 118 to energize coil 129 which attracts the core 130 and causes the spring finger 133 to move the ratchet wheel and the associated bridging contact one step in a clockwise direction. In this way the bridging contact can be moved into and out of position engaging with the contacts 121 and 123 to make and break the circuit which energizes the receiving apparatus.

With the above mechanism it is therefore possible to tune the receiving apparatus from a remote point so as to cause it to automatically select any one of a plurality of stations which are represented on the control panel and also to turn the set on or off from any one of a plurality of points and control the volume of the set from such points. All this is done with a minimum amount of equipment in the remote control box which can be made very small, its dimensions in fact being substantially those of the drawing in Fig. 15 so that this remote control box or a plurality of them may be placed at various places throughout a home.

A distinctly advantageous feature of this system lies in the fact that during the automatic tuning the speaker is shut off so that no unpleasant howls or noises are produced by tuning while the speaker is on. Where a plurality of speakers are used, it is obvious, of course, that the same apparatus which shifts control of the volume from one of the volume control elements to the other may also shift the speaker circuit connections from one speaker to another at the same time. This control in no way interferes with the manual tuning of the set and its operation of the usual manner, and its size is such that it may be placed between the front panel of the set and the operating elements thereof with the use of very little additional space. The motor which operates the automatic tuning device being always disconnected while the speaker is on creates no objectionable static or noises in the receiving apparatus.

Having thus described my invention what I claim as new and desire to secure by Letters Patent is:

1. In a radio tuner, a rotary tuning shaft, insulating means on said shaft, a selector unit supported by said insulating means comprising a pair of complementary conducting segments provided with locking means arranged in a predetermined radial position, contact means for engagement with a segment to cause rotary movement of the shaft, with said contact means acting to engage said locking means to stop the shaft and the selector unit.

2. A control system for a radio receiver including a driving motor, a selector unit comprising a pair of separated members, contact means for engaging one of said members to cause rotation by said driving motor in one direction or the other depending upon the member engaged, such rotation continuing to a predetermined angular position of said selector unit to cause said contact means to engage both members simultaneously to stop such rotation at such predetermined point.

3. In a tuning device for a radio set, a controller connected to a tuning shaft and including spaced conductors movable therewith and a plurality of contact members in fixed locations relative to the conductors, electric circuits connected to the conductors, contiguous ends of conductors forming a recess, whereby one of the contact members may be projected into said recess to simultaneously complete the electric circuits.

4. A tuning device for a radio receiver including in combination a rotatable tuning shaft, a pair of spaced conductors on said tuning shaft and rotatable therewith, said conductors each having two spaced apart terminal portions and said conductors positioned with respect to one another in a manner to provide a terminal portion of one adjacent a terminal portion of the other, contact means for engaging a conductor to cause rotation of said shaft and adapted to bridge said adjacent terminal portions at a predetermined angular position of said shaft for stopping rotation of said shaft.

5. Control apparatus for an adjustable device, said apparatus including a shaft connected with said adjustable device for moving the latter, a rotor on said shaft including a pair of conducting segments insulated from one another, each segment having a terminal portion in a corresponding position thereon, power means for driving said shaft, and means for discontinuing the driving of said shaft, including a contact member for bridging said terminal portions.

6. Control apparatus for an adjustable device, said apparatus including a shaft connected with said adjustable device for moving the latter, a pair of spaced members on said shaft, each having a terminal portion thereon correspondingly positioned with respect to one another and insulated from one another, power means for driving said shaft, an electrical circuit including said power means and said terminal portions, and contact means for bridging said terminal portions and acting to stop the movement of said shaft.

7. Control apparatus for a radio receiver comprising a cam unit mounted on a rotary tuning shaft, said unit having a peripheral recess therein and comprising a pair of conducting segments spaced apart at said recess, a shiftable spring contact arm having a projection adapted to enter said recess when said unit is in a predetermined broadcast station setting, means for actuating said spring arm to cause the projection to press against a conducting segment to complete an electric circuit causing said shaft to rotate and retain said arm in engagement therewith until said projection is in registry with said recess, with the spring pressure between the retained spring arm and cam unit causing said projection to spring into said recess whereby to simultaneously engage each conducting segment mechanically and electrically to stop the rotation of said shaft.

8. A tuning system for a radio receiver including a rotary shaft, a reversible motor for driving said shaft, a control unit on said shaft and normally rotatable therewith, said control unit including a pair of separated conducting segments, a contact for engaging one segment or the other to complete a circuit through the engaged segment for causing rotation of the motor in one direction or the other depending upon the segment engaged said rotation continuing to a predetermined point to permit said contact to engage both segments to form a short circuit to render the motor inoperative to rotate the shaft.

9. In a control for a radio receiver, a tuning condenser, a reversible motor to rotate said condenser, a station selecting member rotatable with said condenser including a pair of conducting segments spaced circumferentially to form a gap, with each of said segments in an incomplete energizing circuit, a brush adapted to engage one of said segments to complete the energizing circuit through that segment, the segment engaged governing the direction of rotation of the motor, with said segment rotatable to bring the gap into registry with the brush whereby said brush engages both segments simultaneously to complete and short-circuit the circuits through each segment to stop the motor.

10. In a selective tuning device for radio apparatus, a rotary shaft, a pair of conducting segments on said shaft insulated from one another and insulated from said shaft, electrically controlled power means for driving said shaft clockwise or counterclockwise, contact means for engagement with one segment or the other to actuate the power means to cause rotation of said shaft clockwise or counterclockwise depending upon the segment engaged, each of said segments having a terminal portion at each end to provide a terminal portion of one segment adjacent a terminal portion of the other, and means responsive to the simultaneous engagement of two adjacent terminal portions by said contact means to cause the stopping of said rotary shaft.

11. In a tuning system for radio receiving devices, a tuning device, a rotary shaft for operating said tuning device, a reversible motor for driving said shaft, and control means for moving said tuning device to a predetermined point and stopping it there comprising a pair of complementary conducting segments encircling said shaft each connected to the energizing circuit of the motor so that completion of the motor circuit through one segment causes rotation in one direction, and completion of the motor circuit through the other segment causes rotation in the other direction, control means including a contact element cooperating with said segments to energize said motor and turn the shaft to bring the contact element into engagement with both said segments, and means rendered operative by the connection of both said segments to de-energize said motor and stop said shaft.

12. In a tuning system for radio receiving systems, a tuning device, power means to actuate said tuning device, individual selecting means for different settings of said tuning device operable to cause said power means to actuate the tuning device and adjust it to the selected setting, said individual selecting means each including a member connected to said tuning device for moving it, a pair of complementary conducting segments movable by said member, a contact element normally out of contact with either segment, control means for causing said contact to engage one of said segments, a clutch device actuated by engagement of one segment with said contact element to cause movement of said member by said power means to bring the contact element to a point where it contacts both of said segments, and connections from the contact element and said segments to the clutch device releasing the clutch device when the contact element engages both segments.

13. In a control for a radio receiver driving means therefor, a rotary shaft, a station selecting member on said shaft rotatable by said driving means, said member including a pair of conducting segments spaced circumferentially to form a gap, means for selectively connecting said driving means to said rotary shaft, a brush adapted to engage one of said segments to complete a circuit for energizing said connecting means to connect said shaft and driving means to cause rotation of said station selecting member, an electro-magnet for attracting said brush to said segment, depressible switch means momentarily depressible to complete a circuit through said electromagnet to energize the same, and means for holding said brush in engagement with said conducting segment for a predetermined rotary interval of travel after release of said depressible switch means.

14. In the device of claim 13, said brush including a supplemental contact portion movable therewith and in electrical connection therewith, with said holding means for said brush including a circuit having said supplemental contact portion therein and a stationary contact in electrical connection with said electro-magnet for electrical engagement with said supplemental contact portion.

15. Control apparatus for an adjustable device, said apparatus including a shaft connected with said adjustable device for moving the latter, a plurality of rotors on said shaft, each including a pair of complementary conducting segments insulated from one another, insulating means for mounting said rotors on said shaft and insulating them therefrom, each of said segments having a lateral flange over a portion of the periphery thereof and a terminal portion at each end of said flange with said segments positioned in a manner to provide a terminal portion on the flange of one segment adjacent a terminal portion on the other segment, power means for driving said shaft, and contact means for bridging a pair of adjacent corresponding terminal portions.

16. A control device for controllable apparatus including a rotary shaft, and a selector unit on said shaft acting to control the rotation of said shaft, said unit comprising a pair of conducting segments insulated from one another, with each segment comprising a disc-like body portion and a peripheral lateral flange extending over less than 180° of the periphery of the body portion, each flange formed to provide a shoulder at each end thereof with said segments positioned with respect to one another so that the flanges are substantially coextensive and adjacent shoulders of the flanges are separated to define a gap therebetween, contact means for said selector unit acting to complete an actuating circuit for said rotary shaft and the unit thereon, said contact means having a substantially wedge-shaped projection thereon for initially engaging a conducting segment to cause rotation thereof to a point at which said projection enters one of said gaps for electrical engagement of each segment and mechanical locking of the selector unit.

17. In a control device for controllable apparatus, a rotary shaft, electrically controlled power means for driving said shaft, a selector unit on said shaft for controlling the rotary movement thereof, said selector unit comprising a pair of adjacent conducting segments insulated from one another and each having an engaging edge over less than 180° of the outside thereof, with said segments having a gap common to adjacent ends of the engaging edges, a movable element for contact with an engaging edge for actuation of the power means to rotate said shaft, and means responsive to the simultaneous contact of said movable element with two engaging edges at a gap to stop said shaft.

18. An arrangement for controlling the angular movement of a shaft including driving means for the shaft, control units on said shaft acting to stop the angular movement of the shaft at a predetermined point, each of said control units including a pair of complementary segments with an engaging edge approximately 180° in length on each segment, and said engaging edges oppositely disposed and formed in a manner to provide a recess common to contiguous ends of said engaging edges, a contact element for engagement with an engaging edge of a control unit segment to close an electric circuit actuating said driving means, with said contact element adapted to enter said recess of said control unit to render said driving means inoperative to move said shaft.

19. A control system for a radio receiver including a driving motor, a rotary shaft driven by said motor, a selector unit on said shaft comprising a pair of complementary conducting members each having an engaging surface over approximately one-half the edge portion thereof with said engaging surfaces oppositely disposed with respect to one another and of such shape as to provide a recess at adjacent ends of the oppositely disposed surfaces, a contact element having a wedge-shaped projection upon one end thereof for engaging one surface or the other to energize the motor to cause rotation of said selector unit to a point at which said wedge-shaped projection enters said recess to electrically connect said conducting members to stop said motor and mechanically stop rotation of said selector unit.

20. An arrangement for controlling the angular movement of a shaft comprising means for angularly moving said shaft, a member arranged for movement with said shaft, an element pivotally mounted for movement away from said member and for movement into engagement with said member to stop said shaft at a predetermined point, a manually operable switch, operating means controlled by said switch for moving said element into engagement with said member, and a normally open switch adapted to be closed upon the operation of said operating means to maintain the latter in its operated position following the release of said manually operable switch.

21. An arrangement for controlling the angular movement of a shaft comprising driving means for angularly moving the shaft, movable means acting to stop the movement of the shaft at a predetermined point, an electro-magnet for operating said movable means to stopping position, and circuit means including a manually operable switch for initially rendering said driving means and electro-magnet operative, said circuit means including electrical means acting when said electro-magnet is rendered operative to maintain said driving means and electro-magnet operative upon the release of said manually operable switch.

22. An arrangement for controlling the angular movement of a shaft comprising means for angularly moving said shaft, a member arranged for movement with said shaft, an element pivotally mounted for movement away from said member and for movement into engagement with said member to stop said shaft at a predetermined point, operating means for moving said element into engagement with said member, an operating circuit for said means, a push-button switch for controlling the operation of said operating circuit and a normally open switch connected in parallel with said push-button switch and arranged to be closed upon the operation of said operating means whereby it will maintain the operating circuit for said operating means upon the release of said push-button switch.

23. In a control for a radio receiver, electric driving means, a station selecting member rotatable by said driving means including a pair of conducting segments spaced circumferentially to form a gap, with each of said segments connected to said driving means, a brush adapted to engage one of said segments to complete the energizing circuit through that segment to cause rotation thereof, manually depressible switch means, energizable means adapted to be energized upon momentary depressing of said switch means to cause said brush to engage one of said conducting segments, and means for holding said brush in engagement with said conducting segment for a predetermined rotary interval of travel after release of said switch means.

24. A control device for controllable apparatus including a rotary shaft, a selector rotor on said shaft, driving means for said shaft, and means for extending a circuit through said selector rotor to energize said driving means, said circuit extending means including a contact member having a substantially wedge-shaped projection at one end, an electro-magnet for attracting said contact member to cause the projection to engage the selector rotor surface, a switch for momentary closing to energize said magnet, a stationary contact in electrical connection with the energizing circuit for said magnet, and a supplemental contact portion on said contact member acting upon movement of said contact member for engagement with said stationary contact to maintain said magnet energized after release of the switch means.

25. A control device for controllable apparatus including a rotary shaft, a selector rotor on said shaft including a pair of conducting segments separated peripherally at two oppositely disposed points on the surface of said rotor, driving means for said shaft, means for extending a circuit through a selector rotor segment to energize the driving means, said circuit extending means including a movable contact member, an electro-magnet for attracting said contact member to cause it to engage a rotor segment, a switch for momentary closing to energize said magnet, a stationary contact member in the energizing circuit for said magnet, and a supplemental contact portion on said movable contact member for engagement with said stationary contact member to maintain said magnet energized after release of said switch means to continue energization of said driving means for rotation of the rotor until said movable contact member engages both of said segments at one of said separated peripheral points and simultaneously therewith acts to render said driving means inoperative.

26. An automatic tuning system for radio receiving apparatus including a manually operable tuning element, a motor for adjusting said tuning element, selective control devices for stopping said tuning element at any one of a plurality of positions depending upon the control device operated, and electric means for holding any one of said selective control devices while the tuning element is manually operated whereby the position of the tuning element relative to the held selecting device may be varied at will.

27. An automatic tuning system for radio receiving apparatus including a manually operable tuning element, a motor for adjusting said tuning element, selective control devices for stopping said tuning element at any one of a plurality of positions depending upon the control device operated, said tuning element having means operatively connected therewith for stopping engagement with selected control devices, and electric means for holding any one of said selective control devices while the tuning element is manually operated whereby the position of the tuning element relative to the held control device may be varied at will, with said motor being inoperative to adjust the tuning element during such manual operation.

28. A control device for controllable apparatus, said device having a manually rotatable shaft, a series of control members frictionally mounted on said shaft and normally rotatable therewith but permitting said shaft to turn therein when held, means for driving said shaft, electrical means acting to release the driving means from the shaft at predetermined positions of said control members, and electrically operated means for holding any one of said control members against rotation, whereby to permit manual turning of said shaft independently of said held control member.

29. In a system of the character described, a control device for changing the characteristics of an electrical circuit, said device having a movable element, a manually rotatable shaft for moving said element, a series of cam members frictionally mounted on said shaft and normally rotatable therewith but permitting said shaft to turn therein when held, a motor connected to said shaft, electro-magnetic means to release the motor from the shaft at predetermined positions of said cam members, and electro-magnetic means for holding any one of said cam members whereby to permit manual turning of said shaft independently of said held cam member.

30. A radio tuning device comprising a cam mounted on a rotary tuning shaft, said cam having a recess in a predetermined angular position of said cam corresponding to a selected broadcast station, a movable member having a projection for engagement with said recess for locking said cam against rotary movement, electromagnetic means for drawing said projection into said recess and holding the same therein, and manual means for rotating said shaft while holding said cam to change the angular relation between the cam and the shaft.

31. In a radio tuner, a rotary tuning shaft, insulating means on said shaft, a selector unit supported by said insulating means comprising a pair of complementary conducting segments provided with locking means arranged in a predetermined radial position, a combination contact and stopping member for selective engagement with a segment to cause rotation of the shaft to a point at which said member engages said locking means to stop said shaft and unit, and means for holding the combination member engaged with said locking means to hold said unit stationary while manually rotating said shaft.

32. In a tuning system for a radio receiver including in combination an electric driving motor, a rotor driven by said motor, said rotor including a pair of complementary discs insulated from one another, a contact for engagement initially with one of said discs to extend a circuit through said disc to said motor to cause said motor to rotate to drive said rotor, means including a push-button remote from said radio receiver for extending a circuit through said contact, with said rotor rotatable by said motor to an angular position permitting engagement of both discs simultaneously by said contact to form a short-circuit across circuits including both said discs to cause stoppage of said rotor and render said motor inoperative to drive said rotor.

33. A tuning control system for a radio receiver including in combination, an electric driving motor, a rotary selector unit including a pair of complementary conducting members, a movable contact element, depressible means remote from said radio receiver to cause said contact to engage a conducting member upon the depressing of such means to energize said motor to rotate said selector unit to a predetermined position at which said contact element engages both discs, said contact element causing a short circuit across circuits through each of said conducting members at such predetermined position to render said motor inoperative and stop said selector unit.

34. A control system for controllable apparatus including in combination a rotary shaft, means for rotating said shaft, a control unit supported on said shaft including a pair of spaced conductors insulated from one another and with the contiguous ends of such conductors forming a recess, an electric circuit connected to each conductor, a selector member for said control unit having a projecting portion thereon, means to move said selector member into engagement with one conductor or the other of the control unit to complete an electric circuit through the conductor engaged to cause rotation of the rotary shaft by the rotating means to an angular position at which the projecting portion of the selector member projects into a recess of said control unit, with said projecting portion in the recess acting to stop the rotation of the control unit at that angular position.

35. In a tuning device for a radio set, frequency changing means actuated by a rotary shaft, means for rotating said shaft, a pair of spaced conductors supported on said shaft and movable therewith having contiguous ends forming a stop gap, stationary contact means for electrical connection with each conductor, movable contact means for engagement with one or the other of said conductors to extend a circuit therethrough and initiate rotation of said shaft to a point where said movable contact means is moved into a stop gap at contiguous ends of said conductors to firmly seat therein and effect the stopping of rotation of said shaft and control unit.

36. An arrangement for controlling the angular movement of a shaft comprising a plurality of control members carried on said shaft, with each of said members having a periphery thereon, power means for driving said shaft in a clockwise and a counterclockwise direction, an element corresponding to each control member mounted for movement into engagement with a corresponding member with the periphery of said member defining the limits of initial movement of said element, each of said control members having a recess in the periphery thereof and two oppositely disposed peripheral portions extending peripherally away from said recess, with one of said peripheral portions determining clockwise driving by said power means upon engagement of an element therewith, and the other peripheral portion determining counterclockwise driving by said power means upon such engagement, a manually operable switch for closing a circuit to initiate movement of said shaft to a predetermined angular position, a circuit controlled by said switch having means therein actuated by the closing of said switch to cause pivotal movement of one of said elements until said element is in engagement with the periphery of the corresponding control member, and switch means in said circuit adapted to open when said pivotal element moves into said peripheral recess of the control member after angular movement of said shaft with the pivotal element in engagement with such control member thereon.

37. A tuning device for a radio receiver including in combination a plurality of rotatively supported control units, a double field motor for driving said units, each of said control units including a pair of segmental conductors insulated from each other with contiguous ends of said conductors forming a recess and each conductor electrically connected to a separate motor field so that both conductors are in normally open motor circuits, a plurality of selector contacts with a contact corresponding to each control unit, and each contact having a projection thereon, with said selector contacts adapted to be selectively moved into engagement with a conductor of the control unit corresponding to the contact selected to close a circuit through the motor field connected to the conductor to cause said motor to rotate in a direction to move a recess in said control unit into registry with the projection on the selected contact, with said projection being urged into the recess at that position to cause the control unit and the motor to stop.

38. In a selective tuning device for radio apparatus, movable tuning means, a pair of complementary conducting segments movable with said tuning means with said conducting segments separated but having adjacent end portions, power means for moving said tuning means, a selector member being normally out of engagement with either segment past which said segments move, electrical means including said segments for causing said power means to move said segments in a direction to bring adjacent end portions of said segments beneath said selector member, actuating means connected into said electrical means for moving said selector member into engagement with a segment, and means operative when said selector member is in seated engagement with adjacent end portions of the pair of conducting segments to stop said conducting segments and said power means.

39. A tuning device for a radio receiver including in combination, a rotary shaft, a double field motor for driving said shaft, a plurality of control rotors, each having two substantially complementary peripheral portions together extending over substantially a 360° peripheral path, a recess in said peripheral path, a movable selector finger for each rotor having an end portion adapted to engage a peripheral edge of one rotor portion or the other to determine the direction of rotation of the motor, magnet means for moving said finger into engagement with a peripheral portion, a momentarily depressible switch for closing an energizing circuit for the magnet means, means for completing a motor circuit through one field or the other upon said engagement, and electrical holding means for maintaining said finger on said peripheral edge after release of the switch until the end portion of said finger is projected into such peripheral recess to effect stopping of said rotor.

40. A tuning system for a radio receiver including in combination, a tuning element, means for varying the tuned position of said element including a rotor having a pair of conducting segments insulated from one another, a contact for engagement with one segment or the other depending upon the angular position of the rotor and the segment engaged determining the direction of rotation of said rotor, power means for rotating said rotor having electrical connection therewith, means for energizing said contact to start rotation of said rotor, with said contact acting to cause the stopping of the rotation of said rotor when said contact engages both segments simultaneously.

41. In a tuning device for a radio receiver, a rotary shaft, a plurality of control units on said shaft, each unit including a pair of conducting segments having their engageable edges together extending through substantially 360°, an insulating portion between said segments, with said unit having a recess on the periphery thereof at the insulating portion, a reversible motor including a pair of fields for driving said rotary shaft, with one of said fields adapted for energization for clockwise rotation of the motor and the other field for counterclockwise, electrical connecting means for each of said segments to a corresponding motor field, a movable contact for engagement with one segment or the other to complete a circuit through the field of the motor connected to that segment to cause rotation of the motor and shaft in a corresponding direction depending upon which segment is engaged, said contact having a projecting portion, with said unit rotating with said shaft until the projecting portion of the contact seats in such recess in the unit to effect stoppage of the rotary shaft.

42. A control device for controllable apparatus including a rotary shaft, power means for rotating said shaft, a plurality of rotors on said shaft normally frictionally retained against rotation thereon during a tuning operation, each of said rotors having a recess in the periphery thereof, a plurality of selector fingers corresponding to said plurality of rotors with each finger having a projection at one end thereof, electromagnetic means for selectively pivoting a finger into engagement with a corresponding rotor and maintaining said finger in engagement while said rotor is rotated by said power means to an angular position with the finger projection in such peripheral recess of said rotor, a switch for actuation to initially energize the electromagnetic means and acting when closed to maintain said electromagnetic means energized to hold the finger projection in said recess and retain the rotor against movement while manually rotating the rotary shaft in a rotor adjusting operation to change the relative angular position between said shaft and said rotor, said power means during said manual rotation being inoperative to rotate the shaft.

43. Radio tuning apparatus including in combination a rotary shaft, reversible power means for rotating said shaft, control means in an electrical circuit with said power means and a second control means for electrical engagement with said first control means, with one of said control means comprising a pair of conducting members insulated from one another and the other of said control means comprising a single conducting member, with one of said pair of members being engageable with the single member and said power means being energizable upon said engagement to cause rotation of said shaft in a direction determined by the member of said pair being engaged, with said shaft being rotatable to a predetermined angular position at which said single member is in electrical engagement with both of said pair of members.

44. Radio tuning apparatus including in combination a rotary shaft, power means for rotating said shaft, control means in an electrical circuit with said power means and a second control means for electrical engagement with said first control means, with one of said control means comprising a pair of members insulated from one another and the other of said control means comprising a single member, with one of said pair of members being engageable with the single member, and said power means being energizable upon said engagement to cause rotation of said shaft to a predetermined angular position at which said single member is in engagement with both of said pair of members, with one of said control means having a gap-like portion thereon and the other of said control means having a projecting portion adapted to register with said gap-like portion at said predetermined angular position for mechanical engagement between said first and said second control means to stop the rotation of said shaft.

45. In a radio receiver tuning system having tuning means and means for manually moving said tuning means, the combination of a plurality of adjustable control members operatively connected with said tuning means, a plurality of selector members corresponding to said control members selectively engageable with corresponding control members, and electric means for initially moving a selected selector member into engagement with a corresponding control member and subsequently retaining said selector member in holding engagement with said corresponding control member while manually moving said tuning means to change the relative adjusted position between said tuning means and said control member.

46. In a radio tuner having a rotatable shaft, the combination of a series of control members frictionally mounted on said shaft and rotatable therewith during a tuning operation and adapted to be angularly adjusted with reference to said shaft in a setting operation, power means for driving said shaft, electrical means operable at angular positions of said control members to render the power means non-operable to drive said shaft, electromagnetic means selectively operatively connected with said control members for holding a selected control member against rotation in a setting operation, and means for manually rotating said shaft while holding said selected control member by said electromagnetic means to adjust the angular position of said control member with reference to said shaft.

47. A tuning system for a radio receiver including in combination, a rotary member, a plurality of pivoted selector members movable toward and away from said rotary member, a corresponding plurality of control members supported on said rotary member with each control member having two oppositely disposed engageable edges with a gap-like portion therebetween with each such edge acting to define the limit of movement of a corresponding selector member toward said rotary member, with each of said selector members having a projecting portion thereon for engagement in a corresponding control member gap-like portion, electromagnetic means for selectively moving a selector member into engagement with an edge of the corresponding control member, the edge engaged determining the direction of rotation of said rotary member, said control members during a tuning operation being retained on said rotary member against rotation with respect thereto, manually operable means for rotating said rotary member, with said electromagnetic means acting to selectively cause a selector member projecting portion to project into a corresponding control member gap-like portion and retain the same therein while manually rotating said rotary member in a tuning position setting operation to change the relative position between the rotary member and the selected control member.

48. A tuning system for a radio receiver including in combination, a rotary member, a reversible electric motor for driving said rotary member in a tuning operation, a plurality of pivoted selector members movable toward and away from said rotary member, a corresponding plurality of control members supported on said rotary member with each control member having a pair of oppositely extending engageable edges with a gap-like stop portion therebetween, each such edge acting to define the limit of movement of a corresponding selector member toward said rotary member, with each of said selector members having a projecting portion thereon for engagement in a corresponding control member gap-like portion, means for selectively moving a selector member into engagement with an edge of the corresponding control member, the edge engaged determining the direction of rotation of the motor to drive the rotary member and said rotary member being driven by said motor to a position at which the projecting portion of a selected selector member is in registry with the gap-like portion of the corresponding control member and projects therein to mechanically stop the control member and rotary member therewith.

ALEXANDER W. PLENSLER.